(12) United States Patent
West

(10) Patent No.: US 8,643,986 B2
(45) Date of Patent: Feb. 4, 2014

(54) BIPOLAR PHOTOVOLTAIC ARRAY GROUNDING APPARATUS AND METHOD

(75) Inventor: Richard Travis West, Ragged Point, CA (US)

(73) Assignee: Renewable Power Conversion, Inc., San Luis Obispo, CA (US)

( * ) Notice: Subject to any disclaimer, the term of this patent is extended or adjusted under 35 U.S.C. 154(b) by 23 days.

(21) Appl. No.: 13/279,950

(22) Filed: Oct. 24, 2011

(65) Prior Publication Data

US 2012/0039003 A1   Feb. 16, 2012

(51) Int. Cl.
*H02H 3/00* (2006.01)

(52) U.S. Cl.
USPC .............................................. 361/42

(58) Field of Classification Search
USPC .............................................. 361/42
See application file for complete search history.

(56) References Cited

U.S. PATENT DOCUMENTS

| | | | |
|---|---|---|---|
| 3,917,017 A * | 11/1975 | Deane ...................... | 180/65.245 |
| 4,573,098 A * | 2/1986 | Williston ......................... | 361/42 |
| 2009/0032082 A1 * | 2/2009 | Gilmore et al. ............... | 136/244 |
| 2011/0031813 A1 * | 2/2011 | Falk ................................ | 307/77 |

* cited by examiner

*Primary Examiner* — Jared Fureman
*Assistant Examiner* — Kevin J Comber

(57) ABSTRACT

The invention is an apparatus and method for safely disconnecting a bipolar photovoltaic array from earth ground under normal static operating conditions. The invention senses the voltage to earth on all three terminals of a bipolar photovoltaic array and uses a set of operable contacts to selectively couple or uncouple the DC neutral point of the array (the center tap) to earth ground. When all three terminals of the bipolar array are within the rated voltage capability of the photovoltaic array the DC neutral point is allowed to float.

3 Claims, 1 Drawing Sheet

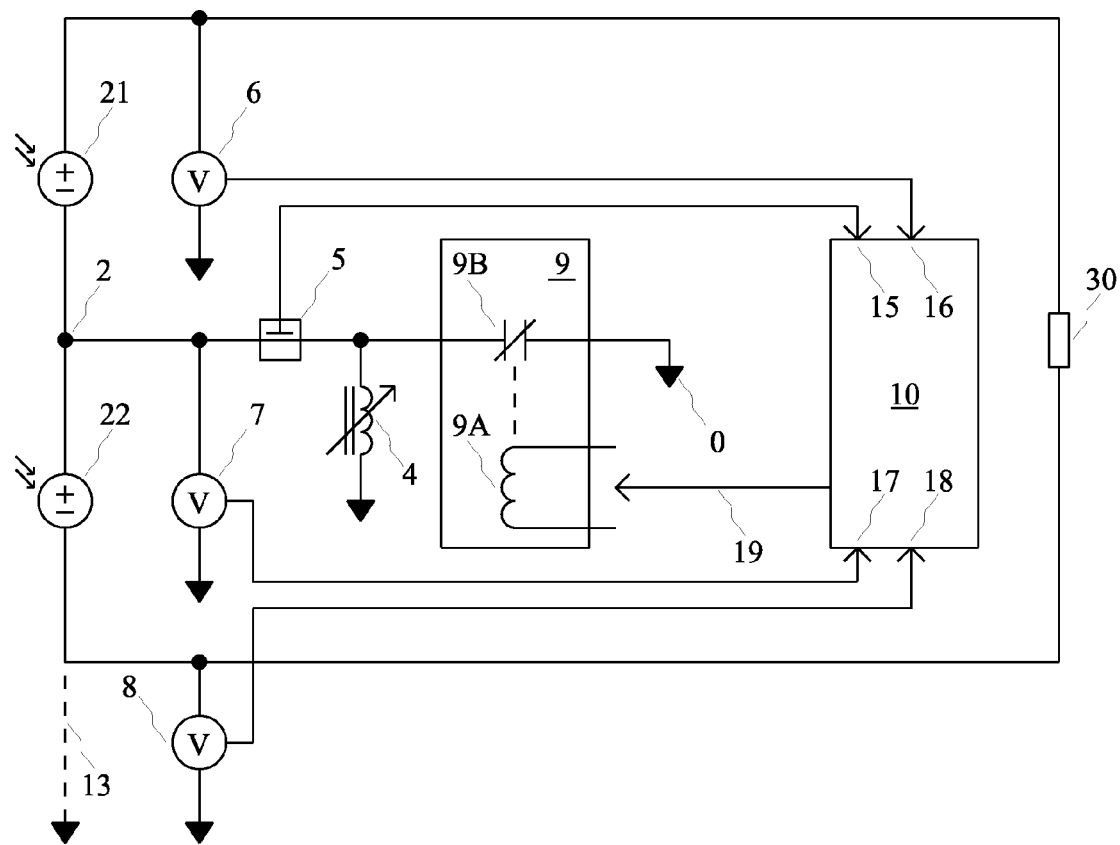

BIPOLAR PHOTOVOLTAIC ARRAY GROUNDING APPARATUS AND METHOD

BACKGROUND OF THE INVENTION

As the solar photovoltaic industry matures, there is a trend toward higher power converter DC input voltages and higher AC output voltages. Higher voltage operation can provide higher energy production efficiencies and reduced costs. One barrier to higher voltage operation is the maximum system voltage rating of solar photovoltaic modules with respect to earth ground. By using a grounded bipolar photovoltaic array configuration, the operational voltage of the power converter can be effectively doubled, compared to using a monopolar array. For bipolar photovoltaic arrays to meet the requirements of the National Electrical Code, the neutral point or center-tap of the bipolar array must be solidly grounded to earth or must have a system in place that provides equivalent protection. In larger photovoltaic systems, power converters are DC to 3-phase, utility grid-interactive types. When sourced from bipolar photovoltaic arrays, these power converters could operate more efficiently if the neutral point of the bipolar array could be safely lifted from earth ground while power is being converted. With the ground lifted, higher AC output voltages could be supported for a given DC input.

BRIEF SUMMARY OF THE INVENTION

The invention is an apparatus and method for safely disconnecting a bipolar photovoltaic array from earth ground under normal static operating conditions. The invention senses the voltage to earth on all three terminals of a bipolar photovoltaic array and uses a set of operable contacts to selectively couple or uncouple the DC neutral point of the array (the center tap) to earth ground. When all three terminals of the bipolar array are within the rated voltage capability of the photovoltaic array, the DC neutral point is allowed to float.

BRIEF DESCRIPTION OF THE DRAWINGS

FIG. 1 is a schematic diagram of the preferred embodiment of the invention.

DETAILED DESCRIPTION OF THE INVENTION

FIG. 1 shows the preferred embodiment of the invention and in the intended application. Monopolar solar photovoltaic sources 21 and 22 are connected at DC neutral point 2 to form a bipolar source. Load 30 is connected between the positive pole of source 21 and the negative pole of source 22. The invention apparatus includes all components or elements shown with the exception of external sources 21 and 22 and external load 30. The circuit ground symbol indicated by reference character 0 is a circuit common to all points with this same symbol. In this example, ground 0 will be considered an earth ground. Voltage sensors 6, 7 and 8 read the voltages with respect to ground 0 at the positive terminal of source 21, DC neutral point 2 and the negative terminal of source 22 and, respectively. The outputs of voltage sensors 6, 7 and 8 are also inputs 16, 17 and 18 respectively, of control circuit 10. Current sensor 5 reads the current flowing between DC neutral 2 and ground 0. The output of current sensor 5 is also input 15 of control circuit 10. Electromechanical contactor 9 comprises actuator coil 9A and normally closed contacts 9B. Actuator coil 9A is driven by output 19 of control circuit 10. Reactor 4 is specifically designed to saturate with specified DC ground fault current. Reference character 13 indicates one possible location for a ground fault.

When the array is not producing power, contacts 9B remain closed. Contacts 9B are normally closed types or latched types. Load 30 will typically be a DC-to-AC 3-phase, utility grid-interactive power converter. Also, in practice, control circuit 10 will be an integral part of or will communicate with the greater power converter control circuit. When there is sufficient array power, the power converter will start with contacts 9B closed. At startup, contacts 9B will be opened when the voltages of sources 21 and 22 are loaded down and transition from open circuit potentials to below some preprogrammed voltage or below some voltage derived from other real time parameters like power converter AC line voltage or power level. At shutdown, when power production ceases, contacts 9B will be closed.

If a "hard" low impedance ground fault 13 is in place and contacts 9B are open, source 22 will be shorted through reactor 4 and source 22 will be held at earth potential. If reactor 4 were not in the circuit and with fault 13 in place and contacts 9B open, the potential at the positive terminal of source 21 would be twice the potential under normal (non-fault) operating conditions, with respect to earth ground. Reactor 4 then prevents an overvoltage photovoltaic array fault during the time it takes to close contacts 9B or depending on the specific apparatus design variant, provides redundancy for contacts 9B where ground faults are concerned.

The invention as illustrated in FIG. 1 is capable of detecting ground fault currents but is not capable of interrupting ground fault currents. The invention is, however, capable of disallowing ground faults from causing array overvoltage conditions. In short, the invention provides a level of overvoltage protection approximating a solidly grounded DC array neutral by monitoring and responding to all overvoltage conditions.

Current sensor 5 serves two purposes, sensing a ground fault current and preventing contacts 9B from opening under load.

An alternate embodiment includes a second set of contacts in series with reactor 4 and under control of control circuit 10.

An alternate embodiment with limited functionality does not include electromagnetic contactor 9 or drive signal 19.

What I claim as my invention is:

1. A direct current electrical power system comprising a bipolar solar photovoltaic array and a means for grounding said bipolar solar photovoltaic array wherein;
    said bipolar solar photovoltaic array comprises two monopolar arrays, each sourcing an associated DC current, solidly coupled in a series aiding arrangement with a common center coupling to configure a three-wire DC circuit and wherein;
    said common center coupling is coupled to earth ground through said means for grounding and wherein;
    said means for grounding comprises a saturable reactor wherein;
    said saturable reactor is of a type that saturates when biased with a predetermined level of DC ground fault current and wherein;
    said DC ground fault current is the difference in said associated DC currents of each of said monopolar arrays.

2. The direct current electrical power system according to claim 1 further comprising a set of operable contacts electrically connected across said reactor wherein said reactor is short-circuited when said set of operable contacts are closed.

3. The direct current electrical power system according to claim 2 further comprising; voltage sensors, current sensors and a control circuit and wherein said set of operable contacts is closed under command of the control circuit when a fault condition is determined based on a fault voltage or a fault current sensed by at least one of the voltage sensors or the current sensors, respectively.

\* \* \* \* \*